United States Patent [19]

Mehrotra et al.

[11] Patent Number: 4,527,115
[45] Date of Patent: Jul. 2, 1985

[54] CONFIGURABLE LOGIC GATE ARRAY

[75] Inventors: Deepak Mehrotra; Rajni Kant, both of Milpitas; Kishor M. Patel, San Jose, all of Calif.

[73] Assignee: Raytheon Company, Lexington, Mass.

[21] Appl. No.: 452,169

[22] Filed: Dec. 22, 1982

[51] Int. Cl.$^3$ .............................. G01R 15/12
[52] U.S. Cl. .............................. 324/73 R; 324/73 PC; 371/21; 371/25
[58] Field of Search ........ 364/580; 324/73 R, 73 AT, 324/73 PC; 371/21, 25

[56] References Cited

U.S. PATENT DOCUMENTS

| 3,961,251 | 6/1976 | Hurley | 324/73 AT |
| 3,961,252 | 6/1976 | Eichelberger | 324/73 AT |
| 3,961,254 | 6/1976 | Cavaliere | 324/73 AT |
| 4,139,818 | 2/1979 | Schneider | 324/73 AT |
| 4,329,640 | 5/1982 | Reiner | 324/73 AT |
| 4,333,142 | 6/1982 | Chesley | 324/73 AT |
| 4,404,519 | 9/1983 | Westcott | 324/73 AT |

OTHER PUBLICATIONS

Bodner, "Generation of Internal Test Signals", IBM Tech Disc Bulletin, vol. 17, No. 8, Jan. 1975, pp. 2396-2397.

Primary Examiner—Michael J. Tokar
Attorney, Agent, or Firm—Richard M. Sharkansky; Joseph D. Pannone

[57] ABSTRACT

A configurable logic gate array having an array of logic gates adapted for selective electrical interconnection to provide a predetermined logic function on a plurality of input logic signals fed to the configured gate array and produce such predetermined logic function as an output signal at an array output terminal. An output buffer circuit is coupled between the output of an interconnected gate and the array output terminal. A parametric testing circuit is responsive to a control signal for electrically coupling, during a normal operating mode, the output of the interconnected gate to the array output terminal, or, during a parameter testing mode, a logic signal source for producing "high" and "low" logic output voltages representative of the logic output voltage produced by the logic gates in response to the logic input signals.

With such arrangement, there is a reduction in the test program development time since bringing the output to the desired state (high or low) be sequencing through function testing to achieve the desired state on the desired pin (an error prone, time consuming process requiring full understanding of the logic implemented and rationale applied by customer in generating test vectors) is eliminated. Further, with such an arrangement, parametric testing of the output signals by the gates in the array is performed by merely driving each output buffer circuit to "high" or "low" logic states thereby reducing parametric testing time of the gate array after the logic gates have been selectively electrically interconnected to provide the desired predetermined logic function.

3 Claims, 2 Drawing Figures

CONFIGURABLE LOGIC GATE ARRAY

BACKGROUND OF THE INVENTION

This invention relates generally to integrated circuit configurable gate arrays and more particularly to output signal parametric testing circuitry for such gate arrays.

As is known in the art, it is frequently desirable to manufacture an integrated circuit component having a large number of identical logic gates arranged in an array. Once such integrated circuit is manufactured, the gates in the array thereof are selectively coupled in accordance with the requirements of a customer, such interconnection typically being done during the final metallization process. Such an integrated circuit is sometimes referred to as a configurable gate array. In this way, the integrated circuit manufacturer is able to produce a large number of identical integrated circuit gate arrays which are suitable for a wide variety of uses and in response to the particular needs of its customers is able to, in the final metallization process, personalize the integrated circuit to provide the logic functions required by its customer. Typically, the integrated circuit manufacturer's customer provides the integrated circuit manufacturer with a logic or truth table relating the logical combination of input signals to produce the desired output signals. This relationship between logic input signals and logic output signals provides the basic functional requirement of the integrated circuit gate array. Once the final metallization process selectively interconnects the gates to implement the desired functional relationship between input signals and output signals, a function test is performed to ensure that proper "high" or "low" (i.e. logic 1 and logic 0 signals) are produced at each output pin of the integrated circuit gate array in response to logic signals fed to the input pins of such integrated circuit. This test is performed at very high speeds since there are typically many logic inputs. In addition to this functional test, the integrated circuit manufacturer must ensure that the output signals of the gate array are produced with proper voltage and current levels. These output voltage or current levels are tested by a parametric test and the output levels typically measured are:

1. The high-level output voltage (i.e. the voltage at an output terminal for a specified output current $I_{OH}$) with input conditions applied that according to the product specification will establish a high level at the output;

2. Low level output voltage (i.e. the voltage at an output terminal for a specified output current $I_{OL}$) with input conditions applied that according to the product specification will establish a low level at the output; and 3. Short circuit output current (i.e. the current flowing into an output when that output is short circuited to ground) (or other specified potential) with input conditions applied to establish the output logic level farthest from ground potential (or other specified potential).

To bring each output (one at a time) to the desired low or high state is a very difficult and time consuming task on behalf of test engineer and sometimes requires several weeks of engineering time for a complex Very Large Scale Integration (VLSI) device.

SUMMARY OF THE INVENTION

In accordance with the present invention, an integrated circuit is provided having an array of logic gates adapted for selective electrical interconnection to provide a predetermined logic function on a plurality of input logic signals fed to the configured gate array and produce such predetermined logic function as an output signal at an array output terminal. An output buffer circuit is coupled between the output of an interconnected gate and the array output terminal. A parametric testing circuit is responsive to a control signal for electrically coupling, during a normal operating mode, the output of the interconnected gate to the array output terminal, or, during a parameter testing mode, a logic signal source for producing "high" and "low" logic output voltages representative of the logic output voltage produced by the logic gates in response to the logic input signals.

With such arrangement, there is a reduction in the test program development time since bringing the output to the desired state (high or low) by sequencing through function testing to achieve the desired state on the desired pin (an error prone, time consuming process requiring full understanding of the logic implemented and rationale applied by customer in generating test vectors) is eliminated. Further, with such an arrangement, parametric testing of the output signals by the gates in the array is performed by merely driving each output buffer circuit to "high" or "low" logic states thereby reducing parametric testing time of the gate array after the logic gates have been selectively electrically interconnected to provide the desired predetermined logic function.

BRIEF DESCRIPTION OF THE DRAWINGS

The foregoing features of this invention, as well as the invention itself, may be more fully understood from the following description read together with the accompanying drawings, in which.

DESCRIPTION OF THE PREFERRED EMBODIMENT

Figure 1:
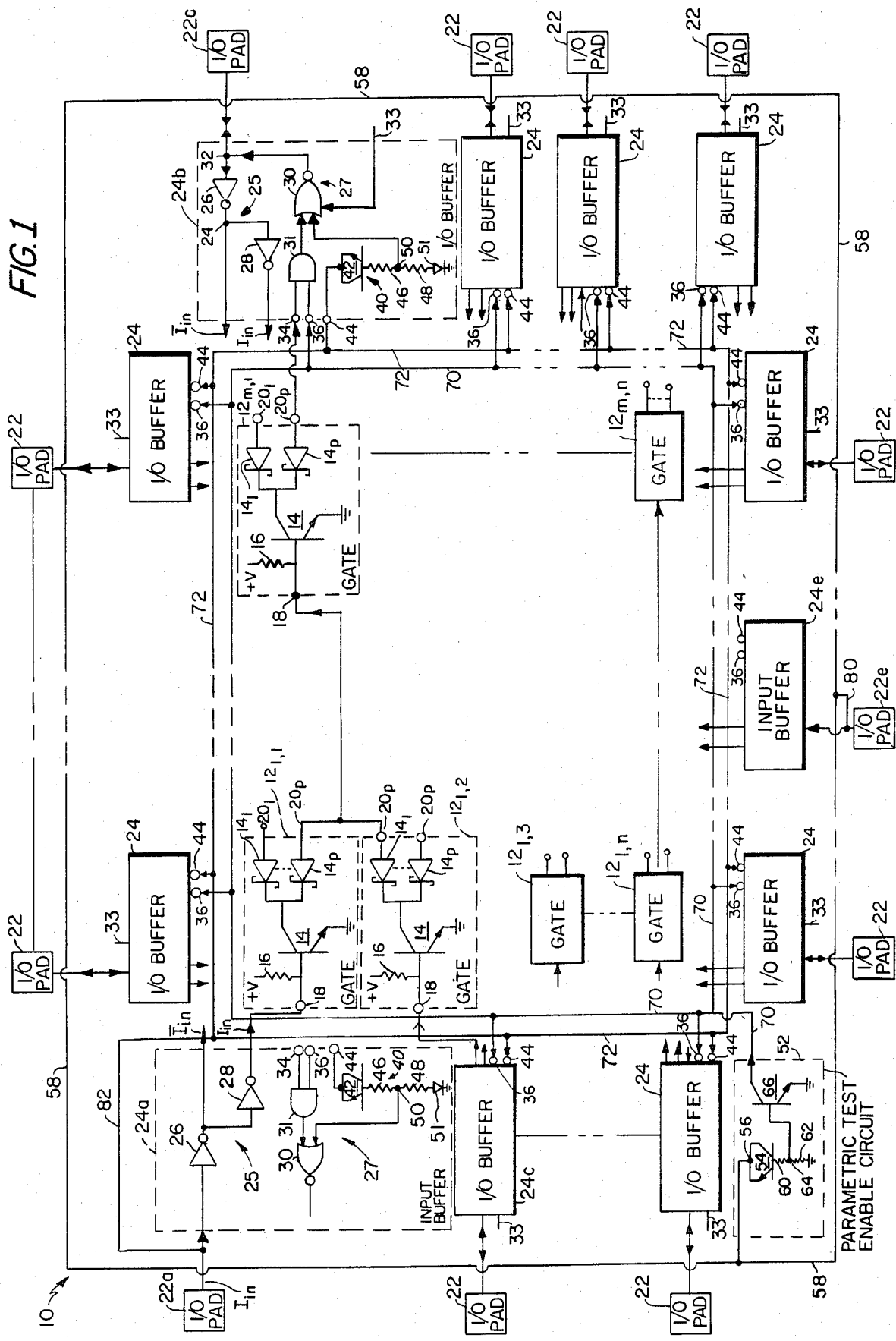
FIG. 1 is a schematic diagram of an integrated circuit logic gate array having a parametric testing circuit according to the invention.

Referring now to FIG. 1, a configurable gate array integrated circuit 10 is shown to include an array of m columns and n rows of logic gates $12_{1,1}$ to $12_{m,n}$ as shown. Each one of the logic gates is identical in construction and gates $12_{1,1}$, $12_{1,2}$ and $12_{m,l}$ are shown in detail to include a grounded emitter transistor 14 having collector electrodes coupled to the cathodes of a plurality of Schottky transistors $14_1$ to $14_p$ and a base electrode coupled to a suitable positive voltage supply (+V) through a resistor 16 and to an input terminal 18. The anodes of the Schottky diodes $14_1$ to $14_p$ are coupled to output terminals $20_1$ to $20_p$ as shown.

The integrated circuit 10 includes a plurality of input/output (I/O) pads 22 disposed about the periphery of the circuit. Each input/output pad 22 is connected to a buffer circuit 24 as shown. Each one of the buffer circuits 24 includes identical components which may be interconnected to provide either an input/output (I/O) buffer as shown in detail for I/O buffer $24_b$, or as merely an input buffer as shown for input buffer $24_a$. Thus, buffer circuits 24 (as shown for buffer circuits $24_a$, $24_b$) include, in the input section 25 thereof, a first inverter 26 having the input thereof connected to a corresponding one of the input/output pads 22 and a second inverter circuit 28 having the input thereof connected to the output of the first inverter circuit 26 to thereby provide a pair of complimentary and true signals $\bar{I}_{in}$, $I_{in}$ at the outputs of the first and second inverter circuits 26, 28 in response to an input signal $I_{in}$ fed to the input/output pad 22 connected thereto. The buffer circiuts 24 in addition to the input section 25 described above, includes an output section 27, such output section 27 including a NOR gate 30 having the output thereof connected to the first inverter circuit 26 and input/output pad 22 connected to such input/output buffer circuit 24 at terminal 32 when interconnected as an input/output buffer as shown for exemplary input/output buffer circit $24_b$, however, such NOR gate 30 output is not electrically connected when such buffer is used as an input buffer as shown for exemplary input buffer $24_a$. Also provided in such output section 27 is an AND gate 31 having the output thereof connected to one input of the NOR gate 30. The AND gate 31 is coupled to a pair of inputs 34, 36 which also provide a pair of inputs for the buffer circuits 24 as shown for exemplary buffer circuits $24_a$, $24_b$. A second input of the NOR gate 30 is connected to a "low" voltage output parameter simulating circuit 40, such circuit 40 including a Zener diode connected transistor 42. Transistor 42 has its emitter and collector electrodes connected together and to a third input terminal 44 of the buffer circuits as shown for exemplary buffer circuits $24_a$, $24_b$. The transistor 42 has the base electrode thereof connected to ground through a pair of resistors 46, 48 serially connected together at a common terminal 50 and a diode 51, as shown. The signal produced at the common terminal 50 is fed to the second input of the NOR gate 30.

The integrated circuit 10 also includes a parametric test enable circuit 52. Such parametric test enable circuit 52 includes a Zener diode connected transistor 54. The transistor has the emitter and collector electrodes thereof connected together at a terminal 56, such terminal 56 being connected to a bus 58 which is disposed adjacent the outer periphery of the integrated circuit 10 as shown. The base electrode of transistor 54 is connected to ground through a pair of resistors 60, 62 which are serially connected together at a terminal 64. The parameter test enable circuit 52 also includes a grounded emitter transistor 66, such transistor 66 having the base electrode thereof connected to terminal 64 and collector electrode thereof connected to a bus 70 which is disposed about the outer periphery of the array of logic gates $12_{1,1}$ to $12_{m,n}$, as shown. A third but 72 is disposed about the bus 70 as shown, such bus 72 being connected to the input terminal 44 of each one of the input/output buffer circuits 24, as indicated. It is noted that bus 70 is connected to input terminal 36 of each one of the input/output buffer circuits 22, as shown. It is also noted that buses 70, 72 are not electrically connected to input terminals 36, 44 of the buffer circuits 24 which are electrically interconnected as input buffer circuits, as shown for input buffer circuit $24_a$. It is further noted that the interconnection, i.e. configuration of the buffer circuits 24 as either an I/O buffer circuit or an input buffer circuit is done during the metallization process at the same time as the array elements are customized.

When integrated circuit 10 is fabricated as described above, it is noted that each of the logic gates $12_{1,1}$ to $12_{m,n}$ has no electrical interconnectins to any other elements of the integrated circuit 10. That is, after fabrication, there are no electrical interconnections to inputs 18 or outputs $20_1$ to $20_p$. Further, the output signals produced by the first and second inverters 26, 28 are not connected to any other components of the integrated circuit 10. Finally, it should be noted that at this point in the fabrication process, the input terminals 34 are not connected to any other circuit elements of the integrated circuit 10. Having mass produced a number of the integrated circuits 10 described above, the logic functions required of the integrated circuit by the integrated circuit manufacturer's customer is provided to the integrated circuit manufacturer to configure, or customize the integrated circuit gate array as required to meet the customer's requirements. Thus, for example, and merely by way of illustration, let it be assumed that buffer $24_a$ is to be configured an an input buffer and that the output of the second inverter circuit 28 of the configured input buffer $24_a$ is to be connected to the input terminal 18 of logic gate $12_{1,1}$ and that buffer circuit $24_c$ is to be configured as an I/O buffer with the first inverter circuit (not shown) in input/output buffer circuit $24_c$ connected to the input terminal 18 of logic gate $12_{1,2}$. Let it further be required that the outputs of Schottky diodes $20_p$ of gate $12_{1,1}$ are to be connected to the Schottky diode $14_1$ of gate $12_{1,2}$. Further, let it be assumed that it is required that the combined outputs of gate $12_{1,1}$ and gate $12_{1,2}$ be connected to the input 18 of gate $12_{m,l}$ and that the output of such gate $12_{m,l}$ is to be produced at input/output pin designated by numeral $22c$ and which is connected to the buffer circuit designated $24_b$. Thus, output pin $20_p$ of gate $12_{m,l}$ is connected to input terminal 34 of input/output buffer circuit $24_b$ which is to be configured as an I/O buffer circuit as described above. Let it further be assumed that the buffer circuit designated $24_e$ is configured as an input buffer circuit. It should be understood that what has just been described is only one of the many electrical interconnections which may be made by the integrated circuit manufacturer during the final metallization process to selectively interconnect the gates $12_{1,1}$ to $12_{m,n}$ together and also the input terminals and output terminals of selected ones thereof to selected buffer circuits 24 to thereby provide the logic funcional relationship which relates logic input signals fed to selected ones of the input/output pads 22 to other selected ones of such input/output pads 22. During the final metallization process wherein the gates of the array are selectively interconnected in accordance with the customer's requirements as regards his logic function requirements, the integrated circuit manufacturer notes various ones of the buffer circuits which are not required for use in implementing the logic requirements of the customer and which have been configured as input buffer circuits such as buffer circuits $24_a$, $24_e$. Once identified, the integrated circuit manufacturer interconnects bus 58 to the input/output pad connected to one of the buffer circuits that is configured as input buffer circuit 24, here to the input/output pad connected to the input/output buffer circuit designated by numeral $24_e$ as shown by electrical interconnect 80 which is connected between the input/output pad designated by numeral $22_e$ and bus 58. Also, the manufacturer interconnects bus 72 to another one of the buffer circuits that is configured as input buffer circuit, here the input/output buffer circuit designated $24_a$, such interconnect being shown by conductor 82. That is, buses 58, 72 may be connected to any one of the buffer circuits 24 which are configured as an input buffer circuit, such as buffer circuit $24_a$, or to an unused one of the buffer circuits 24.

Once configured or customized in accordance with the customer's requirements, the integrated circuit manufacturer applies all possible logic combinations to the input/output pads 22 which are designated by the customer to be fed by input logic signals to determine if proper output logic signals are produced at the specific input/output pins 22 specified by the customer. This functional testing thus is performed to ensure that when proper "high" and "low" input signals are fed to the configured gate array integrated circuit 10, proper "high" and "low" output signals are produced by the configured gate array integrated circuit 10.

Having performed this functional testing of the configured gate array integrated circuit 10, the integrated circuit manufacturer places the integrated circuit 10 in the parametric test mode. This is performed by applying a relatively "high" voltage (i.e. greater than the normal logic "high" voltage) to the one of the input/output pads 22 which has been electrically interconnected to bus 58, here the input/output pad 22 designated by numer $22_e$ which has been electrically interconnected to bus 58 through interconnect 80. In particular, a relatively high voltage here greater than 10 volts is fed to the input/output pad designated by numeral $22_e$ thereby exceeding the breakdown voltage of Zener diode connected transistor 54 producing a relatively high voltage at terminal 64 thereby driving transistor 66 into saturation and thereby producing a logical low (i.e. approximately 0.3 volt) signal on bus 70. The signal on bus 70 is fed to the input terminal 36 of each one of the input/output buffer circuits 24. In order to perform a parametric test on the output signals produced by the input/output buffer circuits 24 which measures the output voltages associated with logical "low" signals, a relatively "high" voltage, here greater than 10 volts (i.e. a voltage greater than the normal logical "high" voltage) is fed to bus 72 through the input/output pad designated $22_a$ and coupled to such bus 72 by interconnect 82, as described above. In response to the relatively "high" greater than 10 volt signal on bus 72, the breakdown voltage of Zener diode connected transistor 42 of the input/output configured buffer circuit (such as I/O buffer circuit $24_b$) is exceeded and a "high" or logical 1 signal is produced at terminal 50, such signal forcing the output of NOR gate 30 to a logical 0 or "low" voltage (approximately 0.3 volts) condition. Thus, with a greater than 10 volt signal applied to input/output pad $22_e$ and applied to input/output pad $22_a$, "low" voltage output parameter simulating circuit 40 thereby produces simulated logical 0 signals at each of the input/output pads 22 which are connected to the input/output configured buffer circuit, as I/O buffer circuit $24_b$, such signals being measured to determine if they meet the parametric output signal requirements of the manufacturer under a "low" level logic output signal condition. In order to test the output parameters of output signals produced to represent "high" logic signals, a logical 0 signal is fed to the input/output pad $22_a$ thereby producing a logical "low" signal on bus 72. This relatively "low" signal does not exceed the Zener breakdown voltage of the Zener diode connected transistor 42 of the I/O buffer circuit ($24_b$) so that terminal 50 represents a logical 0 condition. Further, the level of the voltage at input/output pad $22_e$ is maintained at a voltage greater than 10 volts so that the signal on bus 70 represents a logical 0 level, thus producing a logical 0 level at the output of AND gate 32 regardless of the logical signal fed to terminal 34. Since both signals fed to NOR gate 30 represent logical 0 signals, the output of NOR gate 30 produces a logical 1 signal. It follows then that when a logical 0 signal is fed to input/output pad $22_a$ and a signal greater than 10 volts is fed to input pad $22_e$ to place the integrated circuit 10 in the parametric test mode, the input/output pads 22 which are coupled to the input/output configured buffer circuits (as I/O buffer circuit $24_b$) are forced to produce voltages representative of of logical 1 signals. It should be noted that the breakdown characteristics of the Zener diode connected transistor 42 is selected to simulate the "off" or logical "high" voltage characteristics of each one of the gates $12_{1,1}$ to $12_{m,n}$; that is, to put it another way, during the parametric test enable mode, circuit 40 produces a voltage which is fed to NOR gate 30, such voltage simulating the same voltage that would be produced at the output pin of any one of the logic gates $12_{1,1}$ to $12_{m,n}$. Thus, for example, referring to the input/output buffer circuit designated by numeral $24_b$, the voltage produced by circuit 40 of such numerically designated input/output buffer circuit $24_b$ simulates the same voltage which would be produced by transistor 14 of gate $12_{m,l}$ when such transistor 14 is in the "off" condition. Further, transistor 66 of the parametric test enable circuit 52 together with the characteristics of the Zener diode connected transistor 54 simulates the logic "low" voltage typically produced by any one of the gates $12_{1,1}$ to $12_{m,n}$ when such one of the gates is on the on condition; that is, when the transistor 14 thereof is in a conducting condition to produce a relatively low (i.e. 0.3 volt) signal at the collector electrode thereof.

Finally, during the normal operation mode, standard Transistor-Transistor-Logic (TTL) logic level signals less than less than the 10 volt enable signal are fed to input/output terminals $22_a$, $22_e$ to thereby disable the parameter test enable circuit 52 with the result that the logic signals produced at the inputs 34 of the input/output buffer circuits 24 pass through such circuits 24, albeit inverted, to the input/output pad 22 connected thereto.

Figure 2:
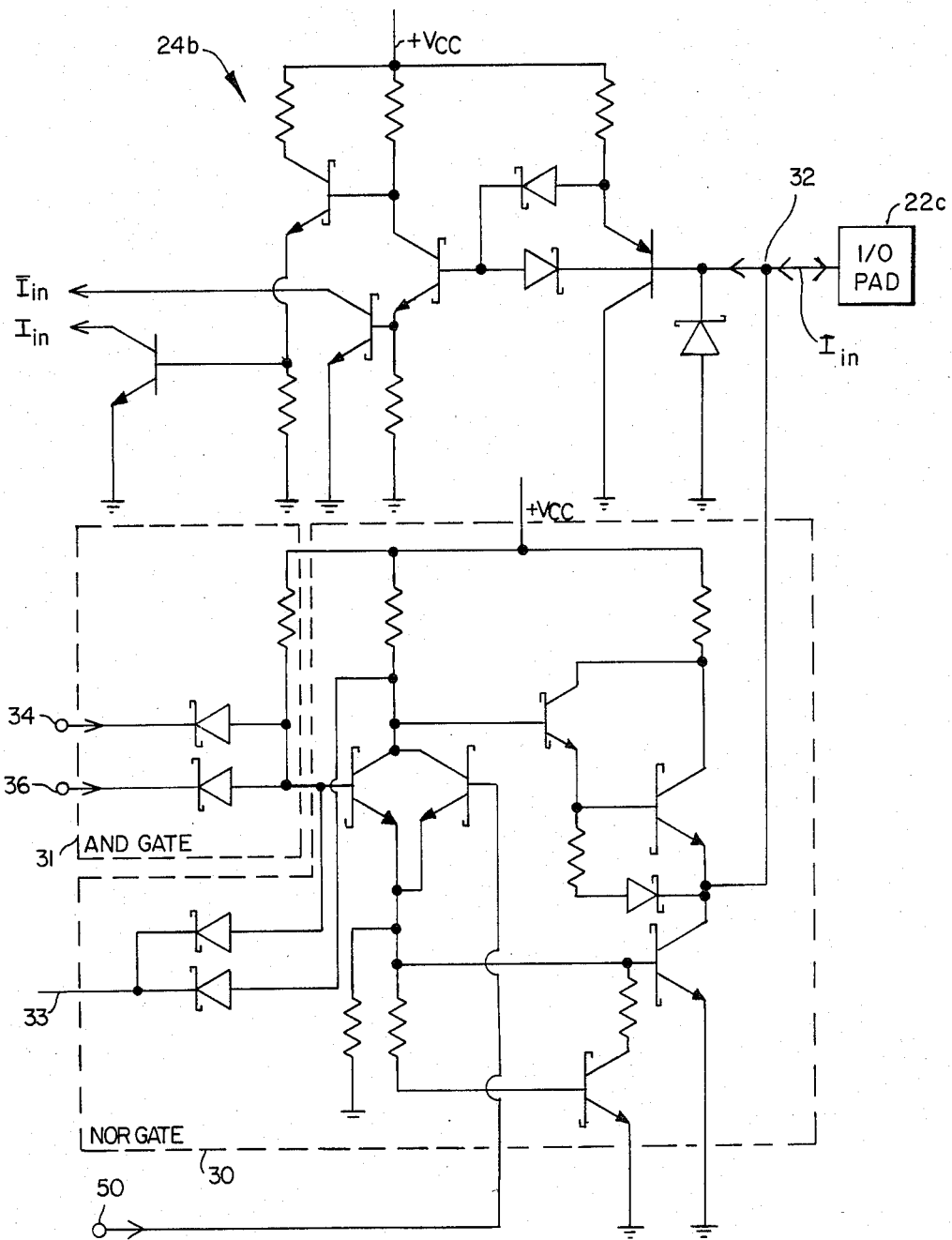
FIG. 2 is a schematic diagram of a portion of an exemplary one of input/output buffer circuits included in the gate array of FIG. 1.

Referring now to FIG. 2, the details of the first and second inverter circuits 26, 28 and the AND and NOR gates 31, 30 of an exemplary input/output buffer circuit, here the input/output buffer circuit designated by numeral $24_b$ are shown. It is noted that when the buffer is configured as an input/output buffer, the buffer also has a three state driver control line 33 and associated circuitry.

Having described a preferred embodiment of this invention, it is evident that other embodiments incorporating these concepts may be used. For example, while Integrated Schottky Logic (ISL) gates have been shown, other types of logic gates such as Transistor-Transistor Logic (TTL) gates or any other type of gates may be used. It is felt, therefore, that this invention should not be restricted to the disclosed embodiment, but rather should be limited only by the spirit and scope of the appended claims.

What is claimed is:
1. An integrated circuit comprising:
(a) a plurality of logic gates adapted for electrical interconnection to provide a predetermined logic function relating the logic states of a plurality of input logic signals to a logic output signal produced at an output terminal; and,

(b) parametric testing circuit means responsive to a control signal for electrically coupling, during a normal operating mode, the logic output signal of the interconnected gates produced at the output terminal to an output pad, or, for, during a parametric testing mode, electrically decoupling the output terminal from the output pad, while electrically coupling to the output pad a parametric signal source, such source producing "high" and "low" output voltages representative of logic output voltages produced by the logic gates in response to the input logic signals.

2. An integrated circuit comprising:
(a) a plurality of logic gates adapted for electrical interconnection to provide a predetermined logic function relating the logic states of a plurality of input logic signals to a logic output signal produced at an output terminal;
(b) an output gate having an output thereof coupled to the output pad; and,
(c) parametric testing circuit means having an output coupled to an input of the output gate and responsive to a control signal for electrically coupling, during a normal operating mode, the output terminal to an input of the output gate, the output gate being driven by the logic output signal at the output terminal to produce a corresponding logic signal at the output pad, or, for electrically decoupling the output terminal from an input to the output gate while electrically coupling to an input of the output gate, during a parametric testing mode, a parametric signal source for producing "high" and "low" logic output voltages representative of logic output voltages produced by the logic gates in response to the logic input signals, the output gate being driven by the parametric signal source to produce "high" and "low" voltages at the output pad.

3. The integrated circuit recited in claim 2 wherein the parametric testing circuit means includes an input gate having one input coupled to the output terminal of the interconnected logic gate and a second input fed by the control signal for electrically coupling or decoupling the output terminal to, or from, a first input of said output gate and wherein the parametric signal source is coupled to a second input of the output gate.

* * * * *

UNITED STATES PATENT OFFICE
CERTIFICATE OF CORRECTION

Patent No. 4,527,115                         Dated July 2, 1985

Inventor(s) Deepak Mehrotra et al

It is certified that error appears in the above-identified patent and that said Letters Patent are hereby corrected as shown below:

Column 3, Line 28:   After "circuits" insert --24--;

Column 3, Line 38:   After "transistor" insert --54--; and

Column 3, Line 67:   Change "interconnectins" to --interconnections--.

Signed and Sealed this

Twelfth Day of November 1985

[SEAL]

Attest:

DONALD J. QUIGG

Attesting Officer

Commissioner of Patents and Trademarks